United States Patent
Kolodzey et al.

(10) Patent No.: US 7,382,032 B2
(45) Date of Patent: Jun. 3, 2008

(54) TERAHERTZ FREQUENCY BAND WAVELENGTH SELECTOR

(75) Inventors: James Kolodzey, Newark, DE (US); Thomas N. Adam, Poughkeepsie, NY (US); Dennis W. Prather, Landenberg, PA (US)

(73) Assignee: University of Delaware, Newark, DE (US)

( * ) Notice: Subject to any disclaimer, the term of this patent is extended or adjusted under 35 U.S.C. 154(b) by 234 days.

(21) Appl. No.: 11/401,717

(22) Filed: Apr. 11, 2006

(65) Prior Publication Data

US 2006/0180762 A1 Aug. 17, 2006

(51) Int. Cl.
*H01B 31/00* (2006.01)
(52) U.S. Cl. .................................. 257/428; 372/98
(58) Field of Classification Search ................ 257/428, 257/414; 372/20, 92, 98, 108
See application file for complete search history.

(56) References Cited

U.S. PATENT DOCUMENTS

| 5,914,497 | A | 6/1999 | Sherwin |
|---|---|---|---|
| 6,009,115 | A * | 12/1999 | Ho ........................... 372/92 |
| 6,563,622 | B2 * | 5/2003 | Mueller et al. ............. 398/182 |
| 6,856,641 | B2 * | 2/2005 | Ksendzov ................... 372/108 |
| 7,245,801 | B2 * | 7/2007 | Boyd et al. .................. 385/27 |
| 2002/0094150 | A1 * | 7/2002 | Lim et al. ..................... 385/15 |
| 2003/0219045 | A1 * | 11/2003 | Orenstein et al. ............. 372/20 |

FOREIGN PATENT DOCUMENTS

WO  WO 01/22139 A1  4/2001
WO  WO 01/27692 A1  4/2001

OTHER PUBLICATIONS

I.V. Altukhov, E.G. Chirkova, V.P. Sinis, M.S. Kagan, UY. P. Gousev, S.G. Thomas, K.L. Wang, M.A. Odnoblyudov, I.N. Yassievich; Towards Si1-xGEx quantum-well resonant-state terahertz laser; Applied Physics Letters; Dec. 10, 2001; pp. 3909-3911; Applied Physics Letters; vol. 79, No. 24; American Institute of Physics.

(Continued)

*Primary Examiner*—Roy Potter
(74) *Attorney, Agent, or Firm*—RatnerPrestia

(57) ABSTRACT

A terahertz (THz) frequency radiation source to emit radiation in a narrow wavelength band within a range of about 3 μm to 3000 μm. This source includes: a broad bandwidth emitter to generate a broad bandwidth emitted wavelength band within the wavelength range; a first planar waveguide optically coupled to the broad bandwidth emitter to transmit the broad bandwidth radiation; a disk resonator evanescently coupled to the first planar waveguide with a resonance wavelength band within the emitted wavelength band; and a second planar waveguide evanescently coupled to the disk resonator to transmit radiation in the narrow wavelength band. The emitted wavelength band has a bandwidth greater than or equal to about 0.01 times a mid-band wavelength. The resonance wavelength band has a resonance wavelength bandwidth of less than or equal to about 0.25 times the emitted bandwidth. The narrow wavelength band is substantially equal to the resonance wavelength band.

11 Claims, 5 Drawing Sheets

OTHER PUBLICATIONS

Senichi Suzuki, Keizo Shuto, and Yoshinori Hibino; Integrated-Optic Ring Resonators with Two Stacked Layers of Silica Waveguide on Si; Nov. 4, 1992; pp. 1256-1258; IEEE Photonics Technology Letters; vol. 4, No. 11.

T-Ray Imaging by D. Mittleman et al. in IEEE Journal of Selected Topics in Quantum Electronics vol. 2, 1996.

Terahertz Technology by P. Siegel in IEEE Transactions on Microwave Theory and Techniques vol. 50, 2002.

Intersubband Electroluminescence from Silicon-Based Quantum Cascade Structures, Science vol. 290, Dec. 22, 2000.

An Eight-Channel Add-Drop Filter Using Vertically Coupled Microring Resonators over a Cross Grid, IEEE Photonics Technology Letters, vol. 11, No. 6, Jun. 1999.

Terahertz Frequency Radiation Sources and Dectectors based on Group IV Materials and Method of Manufacture by J. Kolodzey et al.

\* cited by examiner

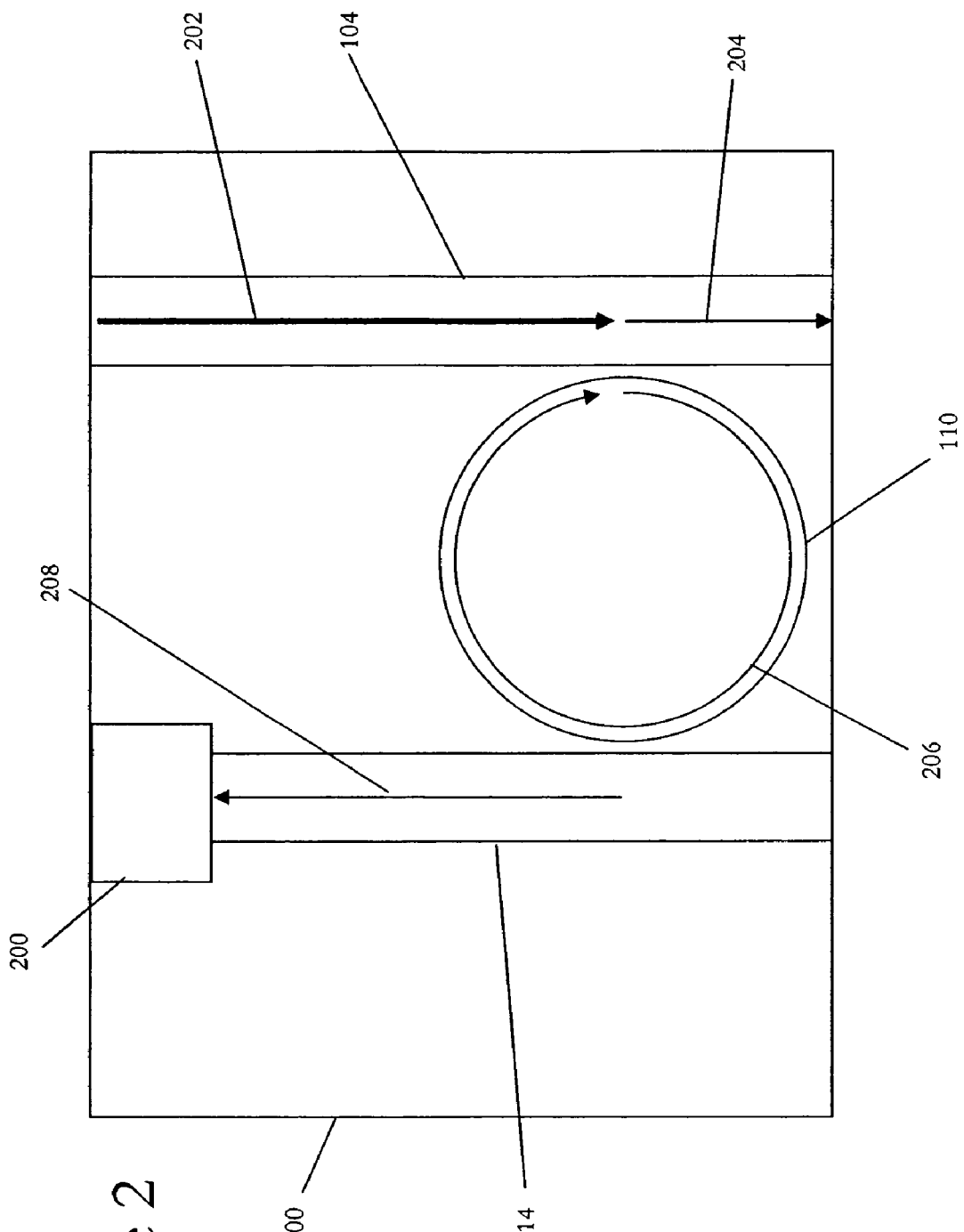

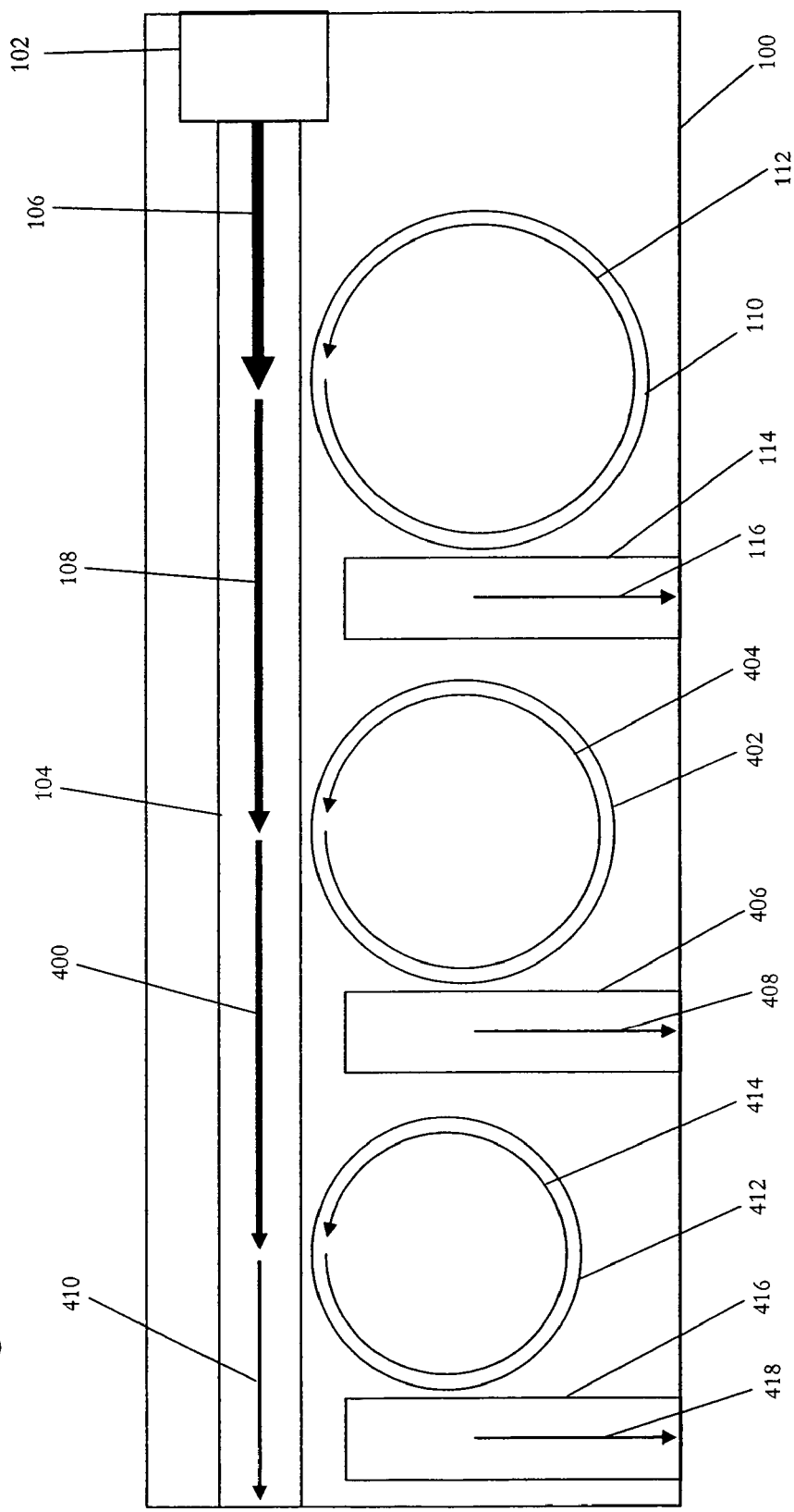

TERAHERTZ FREQUENCY BAND WAVELENGTH SELECTOR

CROSS-REFERENCE TO RELATED APPLICATIONS

This application claims the benefit of U.S. patent application Ser. No. 10/820,517, filed Apr. 8, 2004 which claims priority of U.S. Provisional Application No. 60/461,656 filed on Apr. 9, 2003, the contents of which are incorporated herein by reference.

FIELD OF THE INVENTION

The present invention concerns wavelength selectors designed to transmit a narrow band of terahertz (THz) frequency radiation from the radiation emitted by a broad bandwidth THz frequency radiation source. These wavelength selectors may also be used to narrow the bandwidth of a broad bandwidth THz frequency radiation detector.

BACKGROUND OF THE INVENTION

Imaging, communication, and spectroscopic applications in the mid- and far-infrared regions have underscored the importance of developing reliable sources and detectors operating in the frequency range from 0.1 to 100 THz (3000 to 3 μm wavelength). Recent studies, such as *T-Ray Imaging* by D. Mittleman et al. in IEEE Journal of Selected Topics in Quantum Electronics vol. 2 1996 and *TeraHertz Technolog* by P. Siegel in IEEE Transactions on Microwave Theory and Techniques vol. 50 2002, suggest that terahertz interactions can enable a variety of new applications on a wide range of solids, liquids, gases, including polymers and biological materials such as proteins and tissues.

For example, the resonant frequencies of many rotational and stretching transitions in complex organic molecules, such as proteins, are in this frequency range. Also, phonon energies of polar molecules may be in this range. Thus, THz frequency radiation sources may find significant uses in the fields of spectroscopic analysis and/or photochemical processes involving these molecules.

Compared to microwave devices, devices operating in the THz, or far-infrared, frequency range may allow significant reductions in antenna size, as well as providing greater communication bandwidth. Additionally, the shorter wavelength of THz frequency waves, compared to microwaves, allows greater resolution with THz frequency waves than is possible with microwaves. Commercial applications may include thermal imaging, remote chemical sensing, molecular spectroscopy, medical diagnosis, fire and combustion control, surveillance, and vehicle driver vision enhancement. Military applications may include night vision, rifle sight enhancement, missile tracking, space-based surveillance, and target recognition.

THz frequency radiation has also reported from silicon-based quantum well structures by G. Dehlinger et al. in *Intersubband Electroluminescence from Silicon-Based Quantum Cascade Structures*, Science, vol. 290, Dec. 22, 2000. These silicon-based quantum cascade devices disclosed to provide electroluminescence in the THz frequency band with a minimum bandwidth of about 1.8 μm.

Electrically pumped non-quantum well THz emitters and detectors with relatively broad bandwidths (>10 μm for radiation in the range of about 20 μm to 60 μm) were disclosed in a U.S. Patent Application by J. Kolodzey et al. entitled TERAHERTZ FREQUENCY RADIATION SOURCES AND DETECTORS BASED ON GROUP IV MATERIALS AND METHOD OF MANUFACTURE filed on Apr. 7, 2004. This U.S. Patent Application claims priority from U.S. Provisional Application No. 60/461,656, as does the present application, and is incorporated by reference herein. The broad bandwidth THz emitters disclosed therein provide improved efficiency over the quantum well and optically-pumped examples described above.

Such wide bandwidth devices may have many uses, but in some applications narrower bandwidth THz emitters and/or detectors may be desirable. For example, in thermal imaging, remote chemical sensing, molecular spectroscopy, medical diagnosis, fire and combustion control, surveillance, and target recognition applications, quick initial screening using one or more narrow wavelength bands within the THz range may be desirable. One method to create a narrow bandwidth THz emitter may be to produce a THz frequency laser using a broader bandwidth gain material, such as those described above. This method does not address the creation of a possible narrow bandwidth THz detector, though.

SUMMARY OF THE INVENTION

An exemplary embodiment of the present invention is a terahertz (THz) frequency radiation source to emit THz frequency radiation in a narrow wavelength band within a wavelength range of about 3 μm to 3000 μm. This exemplary radiation source includes: a broad bandwidth THz frequency emitter to generate broad bandwidth THz frequency radiation in an emitted wavelength band within the wavelength range; a first planar waveguide optically coupled to the broad bandwidth THz frequency emitter to transmit the broad bandwidth THz frequency radiation; a disk resonator evanescently coupled to the first planar waveguide with a resonance wavelength band within the emitted wavelength band; and a second planar waveguide evanescently coupled to the disk resonator to transmit THz frequency radiation in the narrow wavelength band. The emitted wavelength band of the broad bandwidth THz frequency emitter has an emitted bandwidth greater than or equal to about 0.01 times a mid-band wavelength, which is within the emitted wavelength band. The resonance wavelength band of the disk resonator has a resonance wavelength bandwidth of less than or equal to about 0.25 times the emitted bandwidth. The narrow wavelength band transmitted by the second planar waveguide is substantially equal to the resonance wavelength band of the disk resonator.

Another exemplary embodiment of the present invention is a THz frequency radiation detector to detect a narrow wavelength band of THz frequency radiation within a wavelength range of about 3 μm to 3000 μm. This exemplary radiation detector includes: a broad bandwidth THz frequency radiation detector with a detection wavelength band within the wavelength range; and a narrow bandwidth THz frequency band wavelength selector coupled to the broad bandwidth THz frequency radiation detector to select and transmit only THz frequency radiation in the narrow wavelength band to the broad bandwidth THz frequency radiation detector. The detection wavelength band of the broad bandwidth THz frequency radiation detector has a detection bandwidth greater than or equal to about 0.01 times the shortest detected wavelength within the detection wavelength band. The narrow bandwidth THz frequency band wavelength selector includes: a first planar waveguide optically to receive input radiation; a disk resonator evanescently coupled to the first planar waveguide with a resonance wavelength band within the detection wavelength band; and a second planar waveguide evanescently coupled to the disk resonator and optically coupled to the broad bandwidth THz frequency radiation detector to transmit the narrow wavelength band of THz frequency radiation from the disk resonator to the broad bandwidth THz frequency radiation detector. The resonance wavelength band of the disk resonator has a resonance wavelength bandwidth of less than or equal to about 0.25 times the detection wavelength bandwidth, and the narrow wavelength band of the second planar waveguide is substantially equal to the resonance wavelength band of the disk resonator.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawing are the following figures:

FIG. 2 a top plan drawing illustrating an exemplary narrow bandwidth THz frequency band detector according to the present invention.

FIG. 4A a top plan drawing illustrating an exemplary multiple-band, narrow bandwidth THz frequency band emitter according to the present invention.

DETAILED DESCRIPTION OF THE INVENTION

In the exemplary embodiments of the present invention, a filter is used in conjunction with a broad bandwidth THz device, either an emitter or a detector, to produce a narrow bandwidth THz device. Such filters have been used in other contexts to narrow bandwidths for other types of emitters and detectors.

For example, in optical communications systems (near infrared band), frequency selective coupling means, i.e., evanescent couplers, have been proposed as an alternative to means that rely on dispersive properties for multiplexer components. A near infrared evanescent coupler, in its simplest embodiment, uses at least two optical waveguides in such close proximity that the propagating mode of the second waveguide is within the exponentially decaying evanescent portion of the propagating mode of the first waveguide. The overlap couples optical energy into the second waveguide if the propagation constants, k, in the two guides are equal. If the values of k are equal at only a single frequency, only energy at that frequency is coupled while energy at other frequencies remains in the first guide. H. F. Taylor describes such a frequency selective coupling scheme in Optics Communications, 8, pp. 421-425, Aug. 1973. The couplers described used optical coupling between two non-identical waveguides to couple the single optical frequency for which the propagation constants in the two guides are equal. Optical bandwidths of approximately several tens of Angstroms may be achieved in 1 cm long couplers thus theoretically permitting about 100 optical channels within the near infrared band typically used in optical communications systems. These systems, however, are not readily controllable.

Micro-ring resonator couplers have also been proposed for use in optical communications systems. One such micro-ring system is described in, S. T. Chu, et al., AN EIGHT-CHANNEL ADD-DROP FILTER USING VERTICALLY COUPLED MICRORING RESONATORS OVER A CROSS GRID, IEEE Photonics Technology Letters, Vol 11, No 6, Jun. 1999. In this work the authors describe the application of micro-ring resonators to add/drop filters. The add/drop filters are formed with a first layer containing a pair of waveguides which form a cross. A micro-ring resonator is disposed directly on top of the waveguides, near their intersection. The edge of the micro-ring resonator overlaps both waveguides allowing optical signals to be coupled from one waveguide into the ring and then from the ring into the other waveguide. This article is hereby incorporated herein by reference for its teaching on micro-ring resonators.

Figures 1A, 1B:
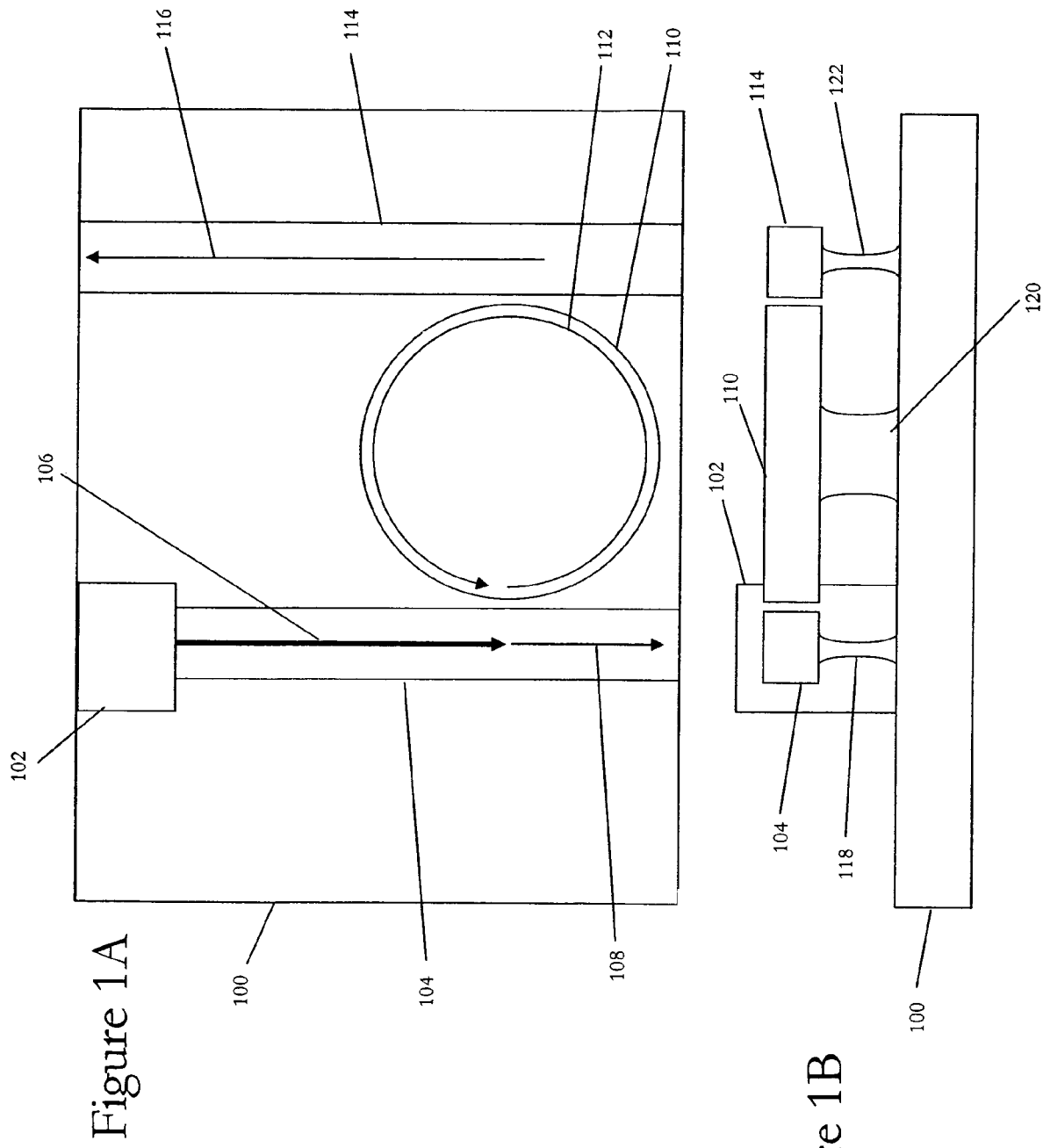
FIG. 1A is a top plan drawing illustrating an exemplary narrow bandwidth THz frequency band emitter according to the present invention.
FIG. 1B is a side plan drawing illustrating the exemplary narrow bandwidth THz frequency band emitter of FIG. 1A.

An embodiment of the present invention, illustrated in FIGS. 1A and 1B, is an exemplary terahertz (THz) frequency radiation source to emit THz frequency radiation in a narrow wavelength band within the wavelength range of about 3 μm to 3000 μm. This exemplary source includes several components coupled to common substrate 100. All of these components may be desirably formed monolithically on substrate 100. Alternatively, some of the components, for example broad bandwidth THz frequency emitter 102, may be formed separately and mounted on substrate 100 after fabrication to be integrated with the components that were formed monolithically on substrate 100.

In the exemplary narrow wavelength band THz frequency radiation source of FIGS. 1A and 1B, broad bandwidth THz frequency radiation 106 is generated by broad bandwidth THz frequency emitter 102. THz frequency radiation 106 is coupled into first waveguide portion 104. As this radiation propagates past resonator portion 110, resonant radiation portion 112 of broad bandwidth THz frequency radiation 106 is evanescently coupled into resonator portion 110. Resonant radiation portion 112 only obtains significant intensity in the resonance wavelength band of resonator portion 110 and the THz frequency radiation in first waveguide portion 104 that is outside of this narrow wavelength band does not significantly couple into resonator portion 110 and, thus, continues to propagate down first waveguide portion 104 as remaining radiation 108. Remaining radiation 108 may be allowed to be emitted out of first waveguide portion 104 or may be absorbed in a beam stop (not shown). Resonant radiation portion 112 is evanescently coupled into second planar waveguide 114 to form narrow bandwidth output THz frequency radiation 116 of this exemplary narrow wavelength band THz frequency radiation source.

The use of disk resonators in the present invention provides several advantages, such as low signal loss and precise wavelength selectivity. Resonant radiation portion 112 is desirably evanescently coupled into the whispering gallery mode of resonator portion 110. The circumference of the disk is ideally equal to an integral multiple of the wavelength to be in resonance. Therefore, the circumference of the disk determines the resonant wavelengths of the cavity, as well as the free spectral range, or wavelength difference between resonant whispering gallery modes. It is noted that, if the disc is large enough then the free spectral range may be smaller than the bandwidth of broad bandwidth THz frequency radiation 106 and, thus two or more resonance bands of the disk resonator may couple significant energy into resonant radiation portion 112 from broad bandwidth THz frequency radiation 106. Also, large disks may lead to undesirably large devices. Therefore it may be desirable to make the disk resonators as small as is practical.

The minimum size of the resonator portion 110 is determined by acceptable coupling losses. As the size of the disk decreases, the curvature of the light path increases. Therefore, it may be desirable that waveguiding material be selected to have a relatively high index of refraction. Also, to assist with the formation of curved surfaces of the resonator it may be desirable for the resonator material to be deposited as an amorphous layer to avoid preferential etching along crystal planes. By using sub-micron semiconductor fabrication techniques to improve surface smoothness, high finesse, low loss, optical ring or disk resonators may be fabricated, which may effectively select a narrow THz frequency wavelength band as resonant radiation portion 112.

Another consideration relating to the finesse of the disk resonator is the means used to couple the resonator to the substrate. Resonator pedestal portion 120 in FIG. 1B is desirably coupled to the center of resonator portion 110 to avoid interacting with the mode volumes of the whispering gallery modes of the disk resonator, which is strongly located near the outer circumference of resonator portion 110.

The disk resonator of the present invention is designed to selectively couple to evanescent optical fields that surround waveguide portions 104 and 114. An evanescent optical field is the portion of the optical field of the light being guided by a waveguide that extends beyond the physical surface of the waveguide. The intensity of the evanescent optical field decays exponentially with distance outside the physical surface of the waveguide. The high finesse of the disk resonator desirably employed in the present invention means that even relatively small evanescent optical field intensities are sufficient to couple signals between the waveguides, but only in relatively narrow ranges about the resonant wavelengths of resonator portion 110. Additionally, this use of evanescent coupling allows signals to be transferred between waveguide portions 104 and 114 without physical contact between the waveguides and the disk resonator.

In FIGS. 1A and 1B resonator portion 110 is shown with waveguide portions 104 and 114 on opposite sides and parallel. Coupling occurs in the regions where the waveguide portions closely approach resonator portion 110. The positioning and orientation of the waveguide portions is not critical. For example, portions 104 and 114 may be perpendicular to one another as in FIG. 3A. It may also be desirable for the waveguide portions to be curved with a similar radius to resonator portion 110 in the coupling region to increase coupling efficiency.

It is possible to couple substantially all of the energy that is in the narrow resonance band of resonator portion 110 of broad bandwidth THz frequency radiation 106 into second waveguide portion 114 as narrow bandwidth output THz frequency radiation 116 through the disk resonator of an exemplary narrow wavelength band THz frequency radiation source of the present invention. This disk resonator works by coupling small amounts of energy from the evanescent field. Due to the low losses within the disk resonator, the magnitude of the field in resonator portion 110 rapidly increases at the resonant wavelength, but not at other wavelengths. Any field in resonator portion 110 may interfere with the fields propagating in waveguide portion 104. Off resonance, this effect is negligible, but at the resonant wavelength the field in resonator portion 110 may become large enough to completely stop radiation in the resonance band from propagating in first waveguide portion 104 past resonator portion 110. At the same time, the field within resonator portion 110 is also coupled to second waveguide portion 114, where there may be no preexisting signal to interfere with this new signal, allowing the new signal to be transferred to second waveguide portion 114. Equilibrium may be reached in which the same amount of energy is taken out of first waveguide portion 104 as is transferred into second waveguide portion 114.

Depending on the coupling and the finesse of the disk resonator, the percentage of energy transferred from first waveguide portion 104 to the second waveguide portion 114 at a given wavelength can range from 0% to 100%. The resonance wavelength band of resonator portion 110 is also affected by the finesse of the disk resonator. In the exemplary THz frequency radiation sources of the present invention, the finesse of the disk resonator is desirably high enough that the resonance wavelength bandwidth of resonator portion 110 is less than or equal to about 0.25 times the emitted bandwidth of broad bandwidth THz frequency emitter 102.

The emitted wavelength band of broad bandwidth THz frequency emitter 102 may desirably be defined to include those wavelengths within the desired THz frequency wavelength range for which the emitter generates spectral power greater than a predetermined level. Broad bandwidth THz frequency emitter 102 is desirably an emitter capable of generating broad bandwidth THz frequency radiation in an emitted wavelength band within the desired wavelength range, for example: a silicon/silicon-germanium quantum well structure intersubband electroluminescence emitter; a resonant state transition emitter; a non-quantum well, doped group IV material emitter, such as those disclosed in the previously described U.S. Patent Application by J. Kolodzey et al.; a blackbody radiation source; or an incandescent radiation source. Some of these exemplary broad bandwidth THz frequency emitters, particularly blackbody or incandescent sources may generate radiation in an even more broad band than the desired THz frequency wavelength range of about 3 µm to 3000 µm. The exemplary THz frequency band wavelength selector of the present invention may still select a narrow bandwidth THz frequency wavelength band from such an extremely broad bandwidth source, thus allowing its use in the exemplary narrow wavelength band THz frequency radiation source of FIGS. 1A and 1B.

It is noted that, in the context of the present invention, the term broad bandwidth is defined relative to the wavelengths in the particular wavelength band. A benchmark ratio of about 100 to 1 for the wavelength of a standard mid-band wavelength to the bandwidth may be used to determine if a wavelength band has a broad bandwidth or not. This means that a wavelength band with a bandwidth of 1 µm may be considered broad for purposes of the present invention if the band includes a mid-band wavelength of 5 µm, but not if the band includes a mid-band wavelength of 500 µm. The mid-band wavelength used to estimate if a given wavelength band has a broad bandwidth may be any wavelength within the wavelength band, but the center wavelength of the wavelength band or the peak intensity wavelength of the wavelength band may be convenient choices. In particular, the peak intensity wavelength may be useful if the power level is variable.

Broad bandwidth THz frequency radiation 106 from broad bandwidth THz frequency emitter 102 may be coupled into first waveguide portion 104 directly if the emitter and first waveguide are formed monolithically on substrate 100. Alternatively, broad bandwidth THz frequency radiation 106 may be coupled into first waveguide portion 104 across an air gap. Additionally, optics (not shown) may be used and an anti-reflection (AR) coating may be formed on the end surface of first waveguide portion 104 adjacent to emitter 102 to improve this coupling efficiency.

This first planar waveguide includes first waveguide portion 104 and first pedestal portion 118 which connects a central portion of the bottom surface of first waveguide portion 104 to substrate 100. First waveguide portion 104 desirably has a substantially rectangular cross-section as shown in FIG. 1B and is formed of a waveguiding material. This waveguiding material is desirably substantially transmissive in the emitted wavelength band of broad bandwidth THz frequency emitter 102. The waveguiding material also has a waveguide index of refraction in this wavelength band which may be desirably 1.5 or higher. It is noted that exemplary waveguiding materials may include one or more: crystalline material formed of one group IV element; crystalline material formed of an alloy of group IV elements; amorphous material formed of one group IV element; amorphous material formed of an alloy of group IV elements; amorphous crystalline material formed of one group IV element; amorphous crystalline material formed of an alloy of group IV elements; polycrystalline material formed of one IV element; or polycrystalline material formed of an alloy of group IV elements. For example, substantially undoped materials formed of one or more group IV elements, such as diamond, crystalline silicon, crystalline germanium, crystalline silicon carbide, crystalline silicon germanium, polycrystalline silicon, amorphous diamond, amorphous silicon, and amorphous germanium, may be desirable waveguiding materials.

First pedestal portion 118 may also be formed of the waveguiding material, in which case the central portion of the bottom surface of first waveguide portion 104 coupled to first pedestal portion 118 is desirably as small as practical. Use of the same material in both portions of the first planar waveguide may simplify fabrication. The reduced size of the coupling area may reduce the mechanical durability of the device, but is desirable to reduce leakage of the THz frequency radiation from first waveguide portion 104 into first pedestal portion 118. It may, therefore, be desirable for first pedestal portion 118 to be formed of a pedestal material with a lower index of refraction than the waveguide index of refraction. Typical index differences may be in the range of 0.25 to 0.5. This pedestal material may be formed of a different group IV material than the waveguide material, or may desirably be formed of the same group IV material base as the waveguide material, but doped to change to index of refraction to the lower pedestal index of refraction. Selection of the dopants to avoid unwanted absorption of the THz frequency radiation in first pedestal portion 118 is desirable.

It is noted that substrate 100 may desirably be formed of the waveguiding material. Alternatively, substrate 100 may be formed of the pedestal material or another material on which the pedestal material may be deposited.

The disk resonator is formed of resonator portion 110 and resonator pedestal portion 120. Resonator portion 110 has a substantially cylindrical shape and is desirably formed of the same waveguiding material as first waveguide portion 104. It is noted that the substantially cylindrical shape of resonator portion 110 may be slightly elongated to provide additional coupling area along each waveguide portion, but that such elongation may undesirably perturb the whispering gallery modes of the disk resonator. Resonator pedestal portion 120 connects a central portion of the bottom surface of resonator portion 110 to substrate 100. Resonator pedestal portion 120 is desirably formed of the same pedestal material as first pedestal portion 118.

The second planar waveguide is formed of second waveguide portion 114 and second pedestal portion 122. Second waveguide portion 114 has a substantially rectangular cross-section similar to first waveguide portion 104 and is desirably formed of the same waveguiding material as first waveguide portion 104. Second pedestal portion 122 connects a central portion of the bottom surface of second waveguide portion 114 to substrate 100. Second pedestal portion 122 is desirably formed of the same pedestal material as first pedestal portion 118 and resonator pedestal portion 120. This second planar waveguide is evanescently coupled to the disk resonator to transmit narrow bandwidth output THz frequency radiation 116, which has a substantially equal wavelength band to the resonance wavelength band of the disk resonator.

As described above it may be desirable for the exemplary THz frequency radiation source illustrated in FIGS. 1A and 1B to be formed monolithically or substantially monolithically using standard semiconductor fabrication techniques. For example, epitaxial techniques, sputtering, vaporization deposition, or evaporation deposition may be used to grow the pedestal and/or waveguide materials. Either wet or dry etch techniques may also be used to form the various features of this exemplary device.

If substrate 100 is formed of the pedestal material, the pedestal may either be grown on the substrate or etched out of the substrate using standard semiconductor fabrication methods. Alternatively, if substrate 100 is desirably formed of waveguiding material, such as a substantially undoped group IV material, or is formed of a different material, but still in the same material family, pedestal material formed of a group IV material, whether doped or undoped, may be grown on the substrate using standard semiconductor fabrication methods. The waveguiding material may be desirably grown on the pedestal material, again using standard semiconductor fabrication techniques.

Selective etching techniques used in fabrication of micro-electrical-mechanical systems (MEMS) may be used to form the pedestals after formation of waveguide portions 104 and 114 and resonator portion 110. Alternatively, the pedestals may be formed before the waveguiding material is deposited and filler material may be grown around the pedestals. The filler material may later be selectively etched after formation of waveguide portions 104 and 114 and resonator portion 110, if desired.

If broad bandwidth THz frequency emitter 102 is formed separately, it may be mounted on substrate 100 after fabrication of the monolithic components by standard techniques such as using solder or epoxy to couple the emitter to the substrate.

Alternatively, broad bandwidth THz frequency emitter 102 may be monolithically formed on the substrate along with the other components. For example the quantum well structure of a silicon/silicon-germanium quantum well structure intersubband electroluminescence emitter or a resonant state transition emitter may be grown and etched to form the emitter and then the waveguide material deposited and etched. The previously described U.S. Patent Application by J. Kolodzey et al. discloses a method of forming a non-quantum well, doped group IV material emitter by selectively doping a region within a substantially undoped material to define the emitter. This doping could be performed in the waveguide material to form such an emitter. The coupling losses from broad bandwidth THz frequency emitter 102 into first waveguide portion 104 may be minimized by this exemplary method.

FIG. 2 illustrates an exemplary THz frequency radiation detector, according to the present invention, to detect a narrow wavelength band of THz frequency radiation within a wavelength range of about 3 µm to 3000 µm. This exemplary THz frequency radiation detector is very similar to the exemplary THz frequency radiation source of FIGS. 1A and 1B. The main differences are the direction of light propagation within these devices, the labeling of the two waveguides, and the replacement of broad bandwidth THz frequency radiation emitter 102 from FIGS. 1A and 1B with broad bandwidth THz frequency radiation detector 200 in FIG. 2.

In this exemplary embodiment, input radiation 202 is coupled into first waveguide portion 104. The spectral characteristics of this input radiation are not necessarily known. Resonant radiation portion 206 of this input radiation, which is in the resonance wavelength band of resonator portion 110, is evanescently coupled into resonator portion 110. As in the exemplary embodiment of FIGS. 1A and 1B, remaining radiation 204 of input radiation 202 may be allowed to be emitted out of first waveguide portion 104 or may be absorbed in a beam stop (not shown). Resonant radiation portion 206 is evanescently coupled into second waveguide portion 114 to form detected THz frequency radiation 208.

Broad bandwidth THz frequency radiation detector 200 has a broad bandwidth detection wavelength band within the wavelength range of about 3 µm to 3000 µm. Exemplary broad bandwidth THz frequency radiation detectors that may be used in the exemplary embodiments of the present invention include: silicon/silicon-germanium quantum well structure detectors; resonant state transition detectors; non-quantum well, doped group IV material detectors, such as those disclosed in the previously described U.S. Patent Application by J. Kolodzey et al.; and bolometers. This broad bandwidth detection wavelength band is defined similarly to the broad bandwidth emitted wavelength band of the exemplary broad bandwidth THz frequency radiation emitter of FIGS. 1A and 1B. The detection bandwidth of broad bandwidth THz frequency radiation detector 200 is desirably greater than or equal to about 0.01 times the shortest detected wavelength in the band. It is noted that the detection wavelength band of broad bandwidth THz frequency radiation detector 200 includes wavelengths within the THz frequency wavelength range for which the broad bandwidth THz frequency radiation detector detects radiation having spectral power greater than a predetermined level.

The narrow wavelength band transmitted to broad bandwidth THz frequency radiation detector 200 by the narrow bandwidth THz frequency band wavelength selector (the two planar waveguides and the disk resonator collectively) is desirably less than or equal to about 0.25 times the detection wavelength bandwidth. This narrow wavelength band is substantially the same as the resonance wavelength band of resonator portion 110.

Figure 3A:
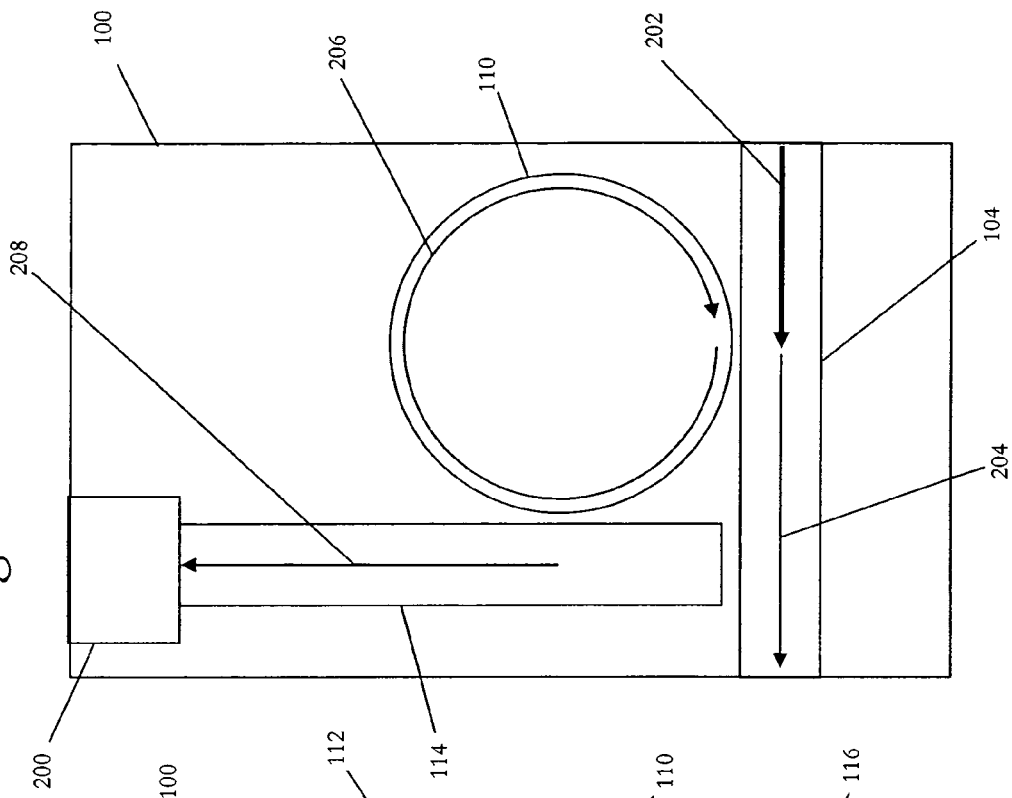
FIG. 3A a top plan drawing illustrating an alternative exemplary narrow bandwidth THz frequency band emitter according to the present invention.
Figure 3B:
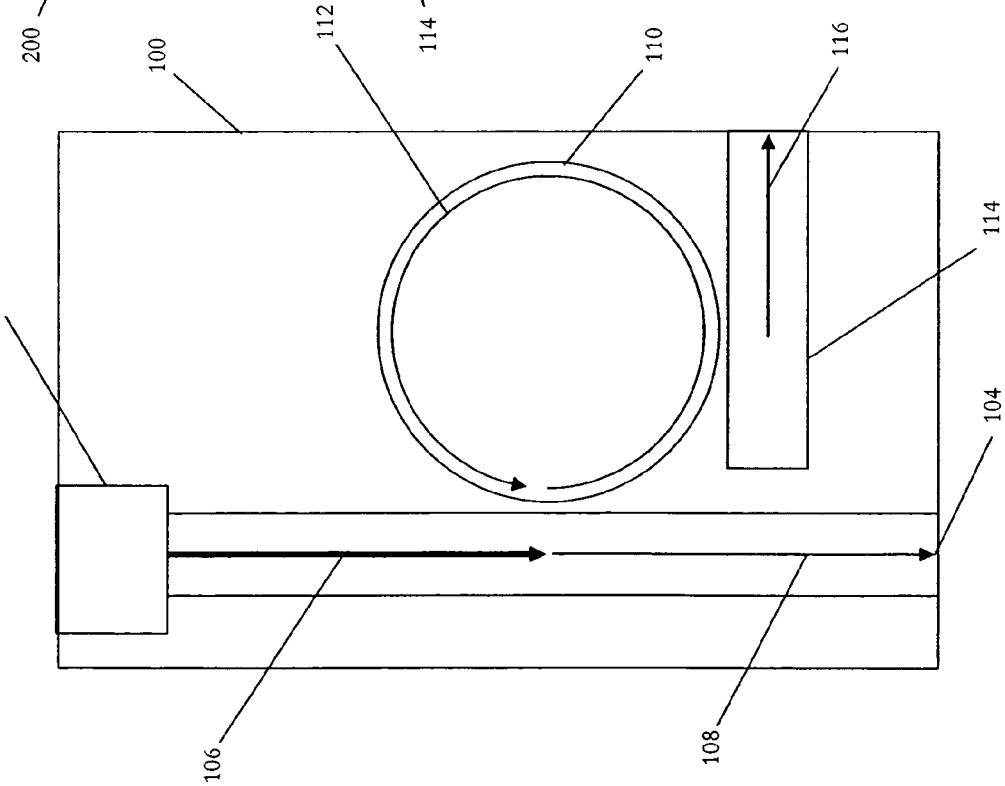
FIG. 3B a top plan drawing illustrating an alternative exemplary narrow bandwidth THz frequency band detector according to the present invention.

FIGS. 3A and 3B illustrate exemplary THz frequency radiation sources and detectors, respectively, in which first waveguide portion 104 and second waveguide portion 114 are perpendicular rather than parallel. It is noted that the choices of parallel in FIGS. 1A, 1B, and 2 and perpendicular in FIG. 3A and 3B are merely illustrative of possible relative angles for the planar waveguides and are not limiting. It is also shown in FIGS. 3A and 3B that second waveguide portion 114 does not extend in front of first wave guide portion 104. This may reduce unwanted coupling of the remaining radiation outside of the desired resonance frequency range between these waveguide portions. Ending first waveguide portion 104 with a beam stop (not shown) may accomplish the same goal.

FIG. 4A illustrates an exemplary multiple-band (in this case three-band) THZ frequency radiation source according to the present invention. In this exemplary source, additional disk resonators with additional resonator portions 402 and 412 are evanescently coupled to first waveguide portion 104. These additional resonator portions 402 and 412 have additional resonance wavelength bands within the emitted wavelength band that are distinct from the resonance wavelength band of resonator portion 110 (as illustrated by the difference in the diameters of these three resonator portions). The first of these additional resonator portions 402 evanescently couples a portion of remaining radiation 108 into itself as second resonant radiation portion 404. This THz frequency radiation is further coupled into third waveguide portion 406 of a third planar waveguide as second narrow bandwidth output THz frequency radiation 408. Further remaining radiation 400 is evanescently coupled from first waveguide portion 104 into the other additional resonator portion 412, leaving last remaining radiation 410. Third resonant radiation portion 414 is coupled into fourth waveguide portion 416 of a fourth planar waveguide as third narrow bandwidth output THz frequency radiation 418.

Figure 4B:
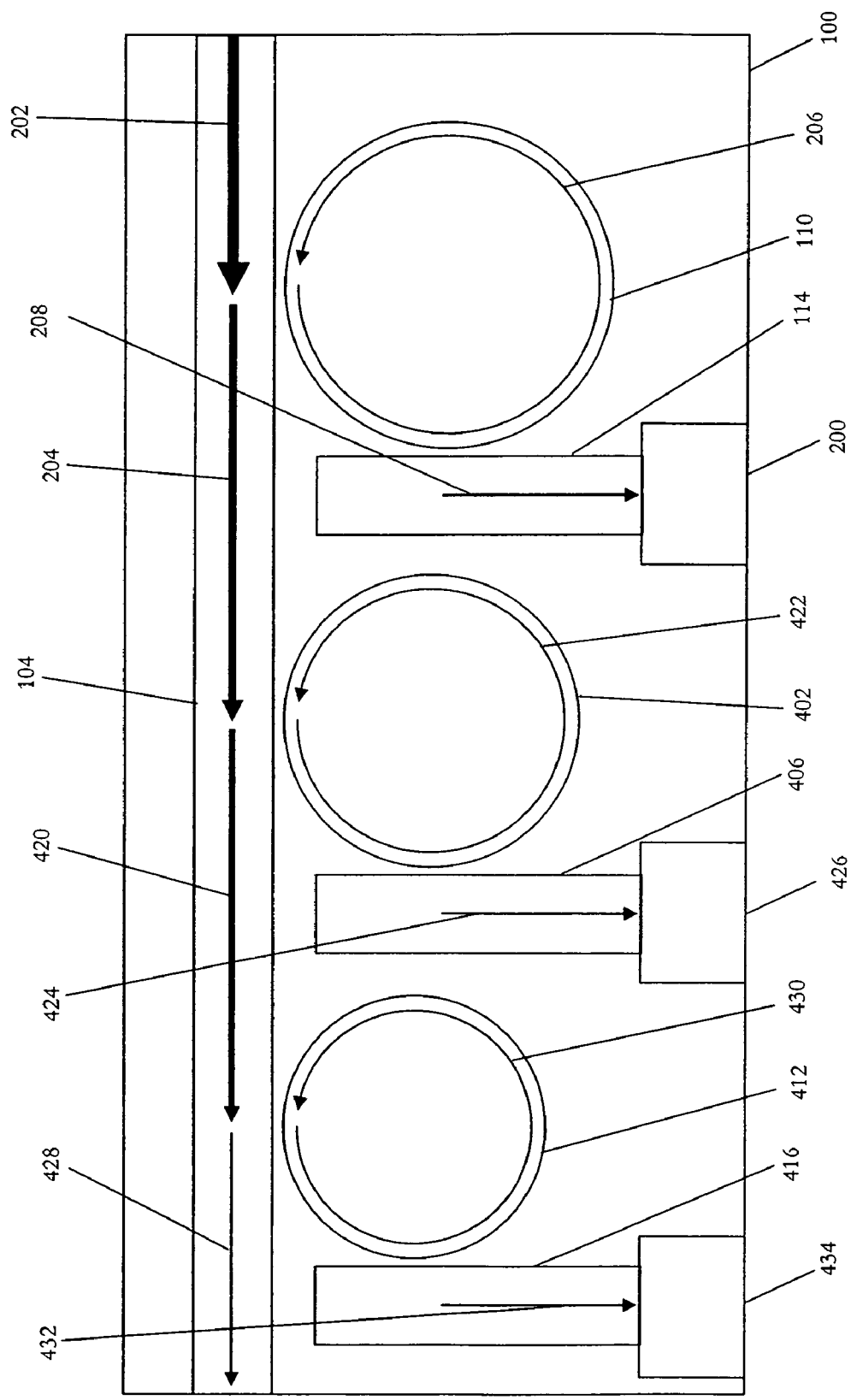
FIG. 4B a top plan drawing illustrating an exemplary multiple-band, narrow bandwidth THz frequency band detector according to the present invention.

FIG. 4B illustrates an exemplary multiple-band (in this case three-band) THz frequency radiation detector according to the present invention. This exemplary detector is similar in operation to the exemplary three band source of FIG. 4A. In this exemplary detector, additional disk resonators with additional resonator portions 402 and 412 are evanescently coupled to first waveguide portion 104. These additional resonator portions 402 and 412 have additional resonance wavelength bands within the THz frequency wavelength range that are distinct from the resonance wavelength band of resonator portion 110. The first of these additional resonator portions 402 evanescently couples a portion of remaining radiation 204 into itself as second resonant radiation portion 422. This THz frequency radiation is further coupled into third waveguide portion 406 of a third planar waveguide as second detected THz frequency radiation 424, which is desirably within the detection wavelength band of second broad bandwidth THz frequency radiation detector 426. Further remaining radiation 420 is evanescently coupled from first waveguide portion 104 into the other additional resonator portion 412, leaving last remaining radiation 428. Third resonant radiation portion 430 is coupled into fourth waveguide portion 416 of a fourth planar waveguide as third detected THz frequency radiation 432, which is desirably within the detection wavelength band of third broad bandwidth THz frequency radiation detector 434. Although it may be desirable for second broad bandwidth THz frequency radiation detector 426 and third broad bandwidth THz frequency radiation detector 434 to have the same detection wavelength bands as first broad bandwidth THz frequency radiation detector 200, this is not necessary. In either case, the resonance bandwidths of each disk resonator are desirably less than or equal to about 0.25 times the detection wavelength bandwidth of the associated broad bandwidth THz frequency radiation detector.

The exemplary embodiments described above demonstrate a number of THz frequency radiation sources (and detectors) based on group IV material processing technologies. These exemplary sources (and detectors) may find use in wide ranging fields, including biological, chemical, and medical imaging and various sensing applications. Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A terahertz (THz) frequency radiation source to emit THz frequency radiation in a narrow wavelength band within a wavelength range of about 3 μm to 3000 μm comprising:
    a broad bandwidth THz frequency emitter to generate broad bandwidth THz frequency radiation in an emitted wavelength band within the wavelength range, the emitted wavelength band having;
        a mid-band wavelength within the emitted wavelength band; and
        an emitted bandwidth greater than or equal to about 0.01 times the mid-band wavelength;
    a first planar waveguide optically coupled to the broad bandwidth THz frequency emitter to transmit the broad bandwidth THz frequency radiation;
    a disk resonator evanescently coupled to the first planar waveguide with a resonance wavelength band within the emitted wavelength band, the resonance wavelength band having a resonance wavelength bandwidth of less than or equal to about 0.25 times the emitted bandwidth; and
    a second planar waveguide evanescently coupled to the disk resonator to transmit THz frequency radiation in the narrow wavelength band, the narrow wavelength band being substantially equal to the resonance wavelength band of the disk resonator.

2. The THz frequency radiation source of claim 1, wherein the broad bandwidth THz frequency emitter is one of:
    a silicon/silicon-germanium quantum well structure intersubband electroluminescence emitter;
    a resonant state transition emitter;
    a non-quantum well, doped group IV material emitter;
    a blackbody radiation source; or
    an incandescent radiation source.

3. The THz frequency radiation source of claim 1, wherein:
    the first planar waveguide includes;
        a first waveguide portion having a substantially rectangular cross-section and a bottom surface, the first waveguide portion formed of a waveguiding material, the waveguiding material being substantially transmissive in the emitted wavelength band and having a waveguide index of refraction; and
        a first pedestal portion connecting a central portion of the bottom surface of the first waveguide portion to a substrate;
    the disk resonator includes;
        a resonator portion having a substantially cylindrical shape and a bottom surface, the resonator portion formed of the waveguiding material; and
        a resonator pedestal portion connecting a central portion of the bottom surface of the resonator portion to the substrate; and
    the second planar waveguide includes;
        a second waveguide portion having a substantially rectangular cross-section and a bottom surface, the second waveguide portion formed of the waveguiding material; and
        a second pedestal portion connecting a central portion of the bottom surface of the second waveguide portion to the substrate.

4. The THz frequency radiation source of claim 3, wherein the waveguiding material is a substantially undoped material formed of one or more group IV elements.

5. The THz frequency radiation source of claim 4, wherein the substantially undoped material formed of one or more group IV elements includes at least one of:
    a crystalline material formed of one group IV element;
    a crystalline material formed of an alloy of group IV elements;
    an amorphous material formed of one group IV element;
    an amorphous material formed of an alloy of group IV elements;
    an amorphous crystalline material formed of one group IV element;
    an amorphous crystalline material formed of an alloy of group IV elements;
    a polycrystalline material formed of one IV element; or
    a polycrystalline material formed of an alloy of group IV elements.

6. The THz frequency radiation source of claim 4, wherein the substantially undoped material formed of one or more group IV elements is selected from a group consisting of: diamond, crystalline silicon, crystalline germanium, crystalline silicon carbide, crystalline silicon germanium, polycrystalline silicon, amorphous diamond, amorphous silicon, and amorphous germanium.

7. The THz frequency radiation source of claim 3, wherein:
    the first pedestal portion of the first planar waveguide is formed of the waveguiding material;
    the resonator pedestal portion of the disk resonator is formed of the waveguiding material;
    the second pedestal portion of the second planar waveguide is formed of the waveguiding material; and
    the substrate is formed of the waveguiding material.

8. The THz frequency radiation source of claim 3, wherein:
    the first pedestal portion of the first planar waveguide is formed of a pedestal material, the pedestal material having a pedestal index of refraction, the pedestal index of refraction being less than the waveguide index of refraction; and
    the resonator pedestal portion of the disk resonator is formed of the pedestal material; and
    the second pedestal portion of the second planar waveguide is formed of the pedestal material.

9. The THz frequency radiation source of claim 1, wherein the mid-band wavelength within the emitted wavelength band is a peak wavelength of the emitted wavelength band.

10. The THz frequency radiation source of claim 1, wherein the emitted wavelength band includes wavelengths within the wavelength range for which the broad bandwidth THz frequency emitter generates an emitted spectral power greater than a predetermined spectral power.

11. The THz frequency radiation source of claim 1, further comprising:
    an additional disk resonator evanescently coupled to the first planar waveguide with an additional resonance wavelength band within the emitted wavelength band, the additional resonance wavelength band;
        having an additional resonance wavelength bandwidth of less than or equal to about 0.25 times the emitted bandwidth; and
        being distinct from the resonance wavelength band; and
    a third planar waveguide evanescently coupled to the additional disk resonator to transmit THz frequency radiation in the additional resonance wavelength band of the additional disk resonator.

* * * * *